United States Patent [19]
Taguchi et al.

[11] Patent Number: 5,847,941
[45] Date of Patent: Dec. 8, 1998

[54] SWITCHING POWER SUPPLY SYSTEM AND PROCESS

[75] Inventors: Takayuki Taguchi, Saitama; Ryoji Saito, Tokyo, both of Japan

[73] Assignee: Origin Electric Company, Limited, Tokyo, Japan

[21] Appl. No.: 843,535

[22] Filed: Apr. 16, 1997

[51] Int. Cl.⁶ .................................................. H02M 3/335
[52] U.S. Cl. ............................................................... 363/21
[58] Field of Search ................................. 363/16, 20, 21, 363/97, 131

[56] References Cited

U.S. PATENT DOCUMENTS

| | | | |
|---|---|---|---|
| 4,016,482 | 4/1977 | Cielo et al. | 323/289 |
| 4,441,146 | 4/1984 | Vinciarelli | 363/20 |
| 4,595,974 | 6/1986 | Lethellier | 363/21 |
| 4,755,922 | 7/1988 | Puvogel | 363/21 |
| 4,758,937 | 7/1988 | Usui et al. | 363/19 |
| 4,760,512 | 7/1988 | Loftus | 363/20 |
| 4,787,020 | 11/1988 | Hiramatsu et al. | 363/20 |
| 4,805,084 | 2/1989 | Rosen et al. | 363/147 |
| 4,901,214 | 2/1990 | Hiramatsu et al. | 363/19 |
| 4,937,727 | 6/1990 | Leonardi | 363/97 |
| 5,126,931 | 6/1992 | Jitaru | 363/21 |
| 5,260,607 | 11/1993 | Kinbara | 327/427 |
| 5,301,095 | 4/1994 | Teramoto et al. | 363/21 |
| 5,349,514 | 9/1994 | Ushiki et al. | 363/21 |
| 5,353,213 | 10/1994 | Paulik et al. | 363/19 |
| 5,434,768 | 7/1995 | Jitaru et al. | 363/21 |
| 5,457,620 | 10/1995 | Dromgoole | 363/21 |
| 5,471,376 | 11/1995 | Tsai et al. | 363/20 |
| 5,548,503 | 8/1996 | Motonobu et al. | 363/56 |

FOREIGN PATENT DOCUMENTS

| | | |
|---|---|---|
| 2 026 261 | 1/1980 | United Kingdom . |
| 2 097 606 | 11/1982 | United Kingdom . |
| 2 142 193 | 1/1985 | United Kingdom . |
| 2 295 283 | 5/1996 | United Kingdom . |

*Primary Examiner*—Matthew V. Nguyen
*Attorney, Agent, or Firm*—McDermott, Will & Emery

[57] ABSTRACT

A switching power supply system comprises a semiconductor switching device for selectively opening and closing a current path from a dc power source to a load, an inductive component connected in series with the switching device, a series combination of a first diode and a voltage clamp, and a control circuit for controlling the switching device. The series combination is connected in parallel to the switching device or the inductive component such as a transformer or an inductor. The first diode has a carrier lifetime equal to or longer than the switching period of the switching device. A discharge circuit is connected between one terminal of the dc power source and a branch point between the first diode and the voltage clamp, and arranged to regulate an amount of energy returned from the voltage clamp to the dc power source.

25 Claims, 14 Drawing Sheets

SWITCHING POWER SUPPLY SYSTEM AND PROCESS

BACKGROUND OF THE INVENTION

The present invention relates to switching power supply system and process utilizing a semiconductor switching device and a series circuit of a diode and a voltage clamp. In particular, the diode according to the present invention has a carrier lifetime equal to or longer than a switching period of the switching device.

FIG. 15 shows a conventional switching power supply system. In this power supply system, a DC power source 1, at the primary winding of a transformer 2 and a semiconductor switching device 3 such as a MOSFET are connected in series. A series circuit of a first diode 104 and a first capacitor 105 is connected in parallel across the semiconductor switching device 3 in the direction shown in FIG. 15. The secondary side of the transformer 2 is connected to a rectifying diode 6, a flywheeling diode 7, a smoothing inductor 8, a smoothing capacitor 9, and a load 10. The circuit shown in FIG. 15 further includes a resistor 111 connected between the cathode of the first diode 104 and the positive terminal of the dc power source 1, a capacitive component 12 that is a parasitic capacitance of the switching semiconductor device 3 or a resultant capacitance of the parasitic capacitance and the capacitance of a capacitor connected in parallel to the parasitic capacitance, a control circuit 13, and a component 14 that is a second diode 14 connected in parallel to the switching device 3 or a body diode in the case of the switching device 3 being a MOSFET.

In this conventional power supply circuit, however, the semiconductor switching device 3 turns on after the first diode 104 turns to the non-conducting state. If, at this time, the reverse conducting state does not end yet, a short-circuit current flows in the loop of the first diode 104, the first capacitor 105 and the switching device 3, resulting in an increase in loss and noise. Therefore, this system requires a diode of a short carrier lifetime as the first diode 104.

Furthermore, a current equal to the average of a current flowing into the first capacitor 105 is discharged through the resistor 111 and hence the loss in the resistor 111 is increased. This switching circuit is arranged to return the charged power through the resistor 111 to the dc power source. This increases the loss in the resistor 111 and deteriorates the efficiency.

FIG. 16 shows a conventional resonant converter type power supply system. This circuit includes a resonant capacitor 12' connected in parallel to a semiconductor switching device 3, an inductance Lr corresponding to a sum of an inductance of wiring providing a part or all of a resonant inductance and a leakage inductance of a transformer 2, and a saturable inductor 21 having a characteristic shown in FIG. 17. The saturable inductor 21 is arranged to provide a high inductance during a resonant period of a small current flowing from the positive terminal of the dc power source 1 through the primary winding 2A of a transformer 2 and the saturable inductor 21 during the off period of the semiconductor switching device 3, and to decrease the inductance sharply by magnetic saturation when the semiconductor switching device 3 turns on.

A rectifying diode 6 is connected in series to the secondary winding 2B of the transformer 2. A flywheel diode 7 is connected across the series combination of the secondary winding 2B and the rectifying diode 6. An output filter composed of a smoothing inductor 8 and a smoothing capacitor 9 is connected between the flywheel diode 7 and a pair of output terminals 10a and 10b. A resonant capacitor 22 is connected in parallel to the rectifying diode 6. A control circuit 13 delivers such a control signal to the semiconductor switching device 3 as to hold a dc output voltage between the output terminals 10a and 10b at a preset voltage. Although a detailed explanation is omitted herein, the resonant converter can achieve a zero voltage switching operation in a wide current range.

This conventional resonant switching power supply circuit, however, increases the required withstand voltage of the semiconductor switching device and hence the cost of the system because the implementation of a desirable resonant operation over a wide range of load current requires the application of excessively high voltage across the semiconductor switching device.

SUMMARY OF THE INVENTION

It is therefore an object of the present invention to provide switching power supply system and process which employs a diode having a long carrier lifetime longer than a switching period and thereby reduces the power loss without increasing the number of circuit components.

It is another object of the present invention to provide switching power supply system and process which switch between a small resonant capacitance and a large voltage clamping capacitance, provide optimum resonance performance, achieve zero voltage switching operation without increasing the voltage and current of a semiconductor switching device excessively over a wide range of load current, and improve the power efficiency.

It is still another object of the present invention to provide switching power supply system and process which ensure the resetting operation of a transformer without the need for a reset switch for the resetting and its control circuit.

It is still another object of the present invention to provide switching power supply system and process which control the discharge of energy accumulated in a voltage clamping capacitor, and by so doing, hold the switching frequency of a semiconductor switching device approximately at a constant level or within a narrow range, irrespective of variation in the output voltage or load current.

According to the present invention, a switching power supply system comprises a semiconductor switching device, an inductive component, a series combination of a first diode and a voltage clamp, and a control circuit.

The semiconductor switching device is arranged to selectively open and close a current path from a dc power source to a load.

The inductive component is connected in series with the switching device.

The series combination comprises the first diode and voltage clamp which are connected in series with each other, and the series combination is connected in parallel to one of the switching device and the inductive component.

The control circuit is configured to control the switching device.

The first diode of the series combination has a carrier lifetime which is equal to or longer than a switching period (or cycle time) T of the switching device.

In illustrated embodiments of the present invention, the inductive component is one of a transformer and an inductor.

DETAILED DESCRIPTION OF THE INVENTION

Figure 1:
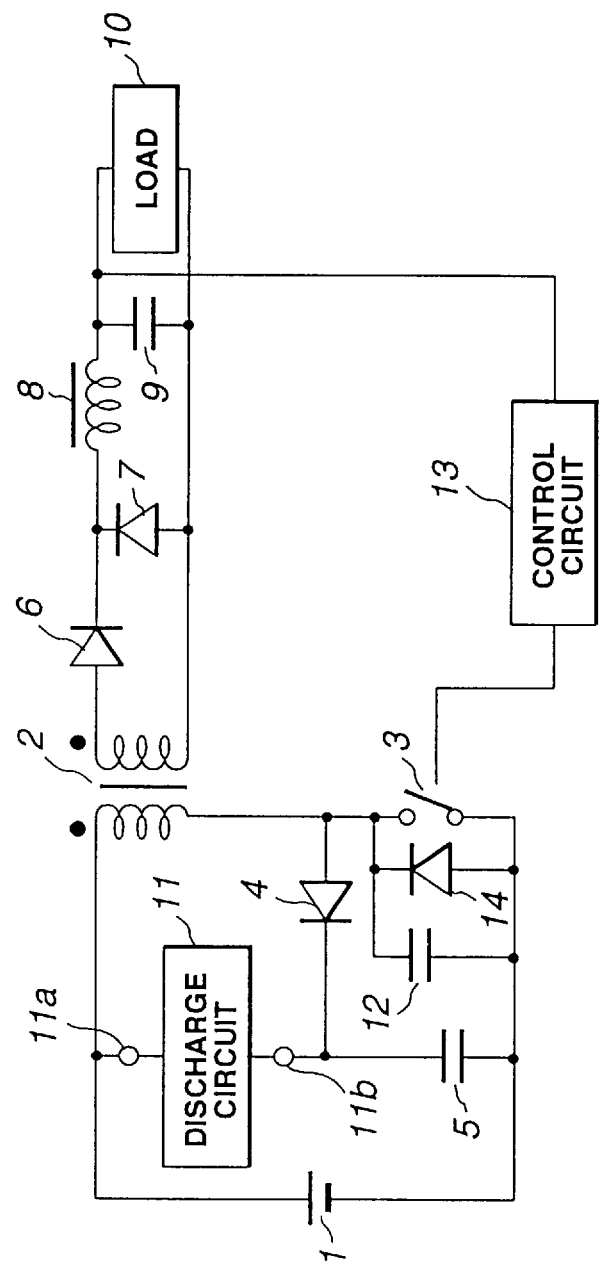
FIG. 1 is a diagram of a switching power supply system according to a first embodiment of the present invention
Figure 2:
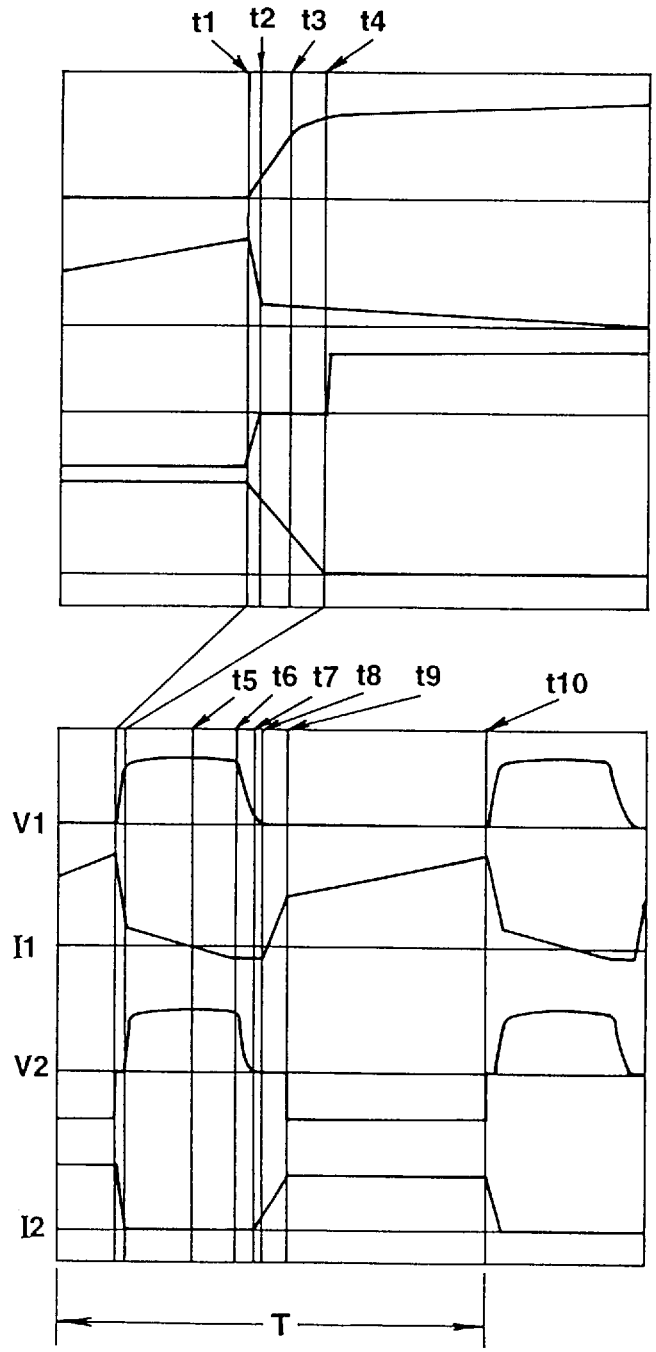
FIG. 2 is a diagram showing waveforms at various points in the circuit of FIG. 1 within a switching period T.
Figure 3:
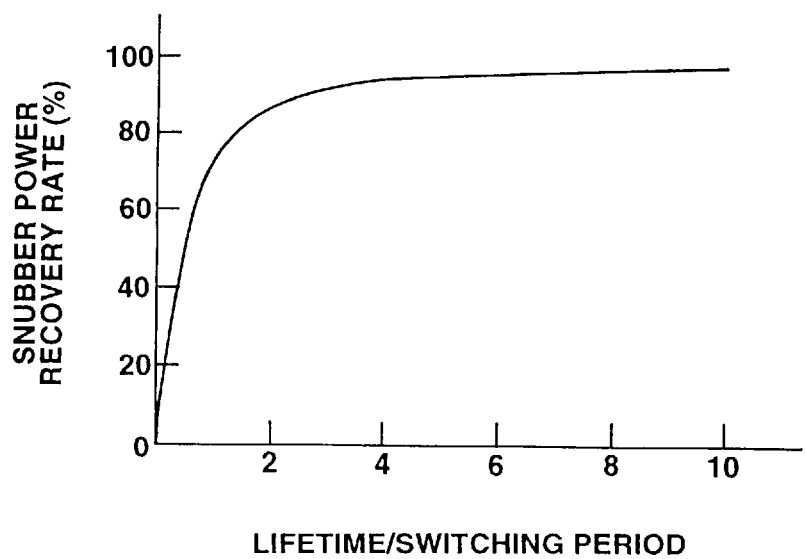
FIG. 3 is a graph showing a power recovery rate with respect to a carrier lifetime of a first diode shown in FIG. 1.
Figure 15:
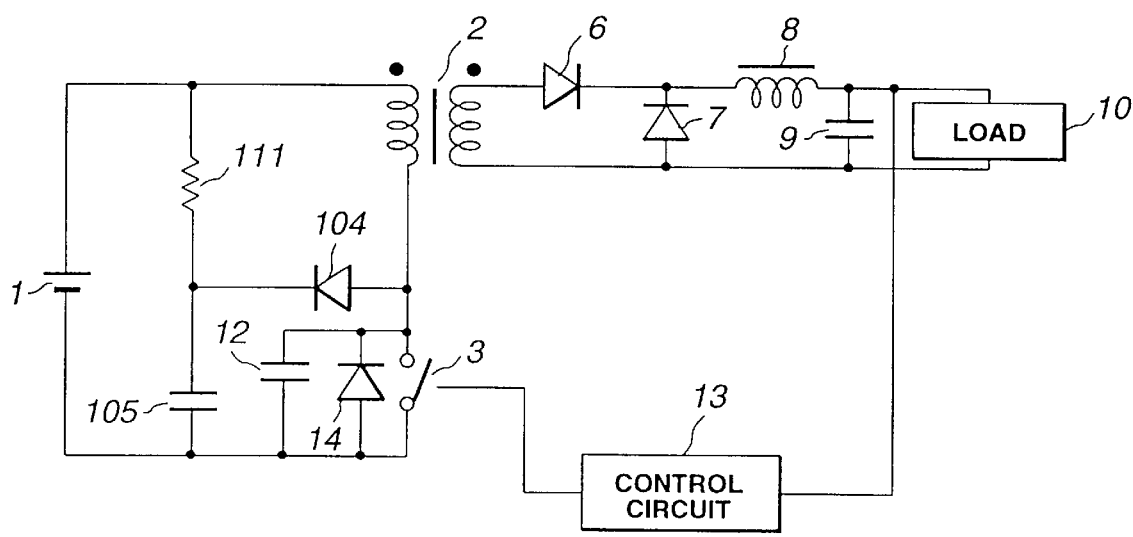
FIG. 15 is a diagram showing a conventional switching power supply system.
Figure 16:
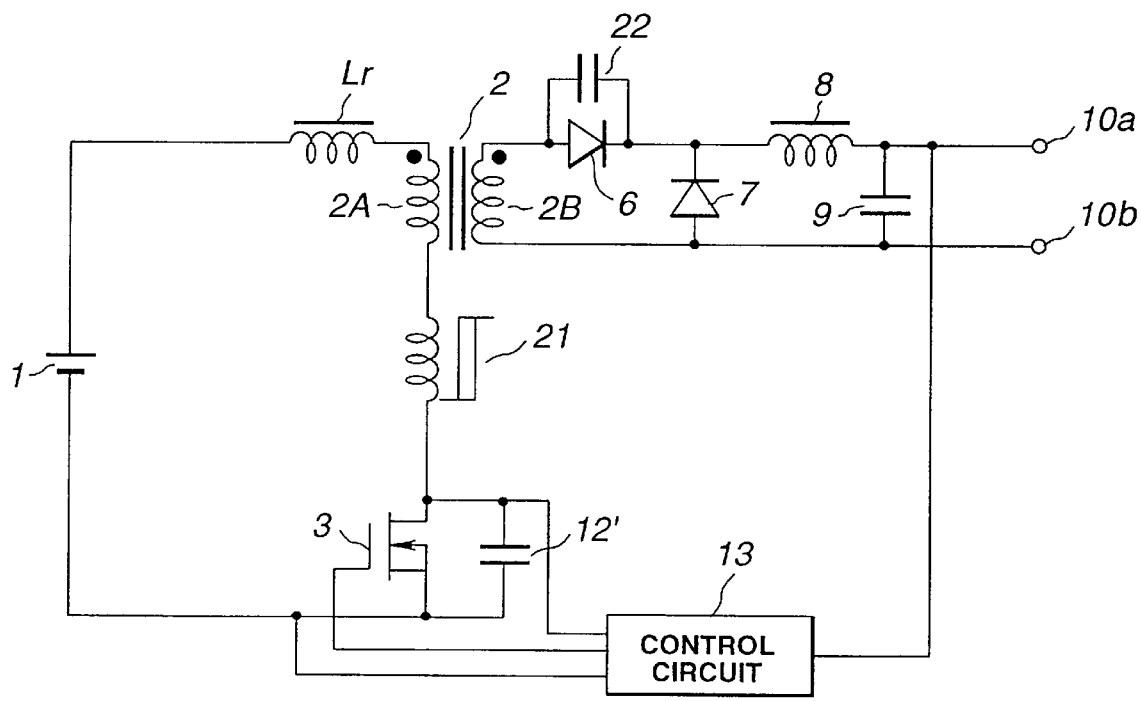
FIG. 16 is a diagram showing a second conventional switching supply system.

FIGS. 1~3 show a first embodiment of the present invention. The same reference numerals as in FIGS. 15 and 16 are used to denote corresponding circuit components.

A switching power supply circuit shown in FIG. 1 comprises a direct current power source 1, an inductive component 2 in the form of a transformer, a semiconductor switching device (or element) 3 such as a MOSFET, a first diode 4, a voltage clamping component (or voltage clamp) 5, a rectifying diode 6, a flywheeling diode 7, a smoothing inductor 8, a smoothing capacitor 9, a load 10, a discharge circuit 11, a capacitive component 12 in the form of a second capacitor, a control circuit 13 and a circuit component 14 in the form of a second diode.

The first diode 4 and the voltage clamping component 5 are connected in series to form a series combination. The first diode 4 has a cathode connected to a first end of the voltage clamping component 5, and an anode connected to a branch point between the inductive component 2 and the switching device 3. The switching device 3 has a first terminal connected to the cathode of the second diode 14, the inductive component 2, and the anode of the first diode 4, and a second terminal connected to the anode of the second diode 14. The voltage clamping component 5 has the first end connected to the cathode of the first diode 4 and a second end connected to the second terminal of the switching device 3. The negative terminal (or second terminal) of the dc power source 1 is connected to the second terminal of the switching device 3.

The transformer 2 comprises primary and secondary windings. The primary winding has a first end connected to the positive terminal of the dc power source 1, and a second end connected to the first terminal of the switching device 3. The secondary winding has a first end connected to the anode of the rectifying diode 6, and a second end connected to the anode of the flywheel diode 7. The cathodes of the diodes 6 and 7 are connected together to a first end of the smoothing inductor 8. The smoothing capacitor 9 has a first end connected to a second end of the inductor 8, and a second end connected to the second end of the secondary winding of the transformer 2. The smoothing inductor 8 and smoothing capacitor 9 form an output filter. The load 10 is in parallel to the capacitor 9.

The first diode 4 of the example shown in FIG. 1 is a charge storage diode having a carrier lifetime equal to or longer than the switching period T of the semiconductor switching device 3. The carrier lifetime is a lifetime of carriers in the diode 4. Although a diode of a longer lifetime has a characteristic of holding the reverse conduction for a longer time than a diode of a shorter lifetime, the long lifetime diode regains the reverse blocking ability when carriers equal to stored carriers are injected from the reverse direction. The present invention is based on this new concept.

In the example shown in FIG. 1, the voltage clamping component 5 is a capacitor for clamping the voltage applied across the semiconductor switching device 3. Alternatively, the voltage clamping component 5 may be a battery such as a dry battery or a storage battery, providing a preset voltage higher than a voltage Ei of the direct current power source 1.

The control circuit 13 is connected to a gate (or control electrode) of the semiconductor switching device (or transistor) 3. The control circuit 13 delivers an on signal to the semiconductor switching device 3 after the reverse operation of the charge storage diode 4 is substantially recovered or when the voltage of the semiconductor switching device 3 is reduced approximately to zero.

The discharge circuit 11 is an auxiliary or secondary circuit. The discharge circuit 11 has a first end 11a connected to the positive terminal (or first terminal) of the power source 1, and a second end 11b connected to a branch point between the cathode of the charge storage capacitor 4 and the first end of the second capacitor 5. FIGS. 11A~11D show practical examples of the discharge circuit 11.

FIG. 2 shows waveforms of the voltage V1 of the semiconductor switching device 3, the current I1 of the primary winding of the transformer 2, the voltage V2 of the secondary winding of the transformer 2, and the current I2 of the secondary winding of the transformer 2 in typical operations of the switching power supply system of this embodiment. The switching period T is between t1~t10.

Interval 1 (t1<t≦t2)

At an instant t1 (t=t1), the semiconductor switching device 3 turns off. The current ceases to flow through the switching device 3 and instead flows into the capacitor 12, and the voltage V1 across the semiconductor switching device 3 increases sharply. At the time when the voltage V1 becomes equal to the voltage Ei of the dc power source 1, the voltage applied to the winding of the transformer 2 is reduced to zero. During this, the voltage V1 across the switching device 3 increases substantially in a linear manner. When the winding voltage of the transformer 2 becomes equal to zero, the flywheel diode 7 turns from the reverse biased state by the voltage of the transformer 2, to the conducting state, and the load current flows through the flywheel diode 7 and the rectifying diode 6, short-circuiting the secondary winding of the transformer 2 at an instant t2.

Interval 2 (t2<t≦t3)

Because the secondary winding of the transformer 2 is short-circuited at the instant t2, the magnetizing current of the transformer 2 is held constant at the current value at the instant t2. The previous state in which the primary current corresponding to the load current and the magnetizing current flow through the capacitor 12 ends, and the current through the capacitor 12 decreases because the path of the load current shifts to the flywheel diode 7. However, the current through the capacitor 12 does not immediately reduce to zero because of the existence of the leakage inductance of the transformer 2 and the inductance of the wiring. Thus, the charging current continues flowing through the capacitor 12, and therefore, the voltage V1 across the switching device 3 continues increasing. When the voltage V1 reaches the voltage of the first capacitor 5, the first diode 4 starts conducting at an instant t3.

Interval 3 (t3<t≦t4)

With the turn of the first diode 4 to conduction at the instant t3, the first capacitor 5 starts serving as a voltage clamp because the capacitance of the first capacitor 5 is chosen to be sufficiently high as compared to the capacitance of the capacitor 12, and the voltage V1 across the switching device 3 is clamped by the voltage of the first capacitor 5. When the charging current of the second capacitor 12 and the first capacitor 5 reduces to the value of the magnetizing current of the transformer 2, the rectifying diode 6 becomes nonconducting, and breaks the short circuit connection of the secondary winding of the transformer 2 at an instant t4.

Interval 4 (t4<t≦t5)

From the end of the short-circuited state of the secondary winding of the transformer 2 at the instant t4, the constant state of the magnetizing current ends, and the magnetizing current starts decreasing. Moreover, the voltage equal to the difference between the voltage of the first capacitor 5 and the source voltage is applied to the transformer 2 so that the magnetizing current is reset. The voltage Vi of the switching device 3 remains clamped by the voltage of the capacitor 5 continuously from the interval 3. An instant t5 is a point in time at which the magnetizing current of the transformer 2 becomes equal to zero.

Interval 5 (t5<t≦t6)

When the charging current of the first capacitor 5 is reduced to zero at the instant t5, the forward conduction of the charge storage diode 4 ends. During the forward conducting period, charges remaining in existence without undergoing recombination are stored in the vicinity of the junction in the charge storage diode 4. Because of the stored residual charges, the charge storage diode 4 is put in a reverse conducting state after the forward conducting state. In the reverse conducting state, a discharge current of the capacitor 5 flows in the loop of the diode 4, transformer 2, dc power source 1, and capacitor 5, and the energy stored in the capacitor 5 during the forward conducting period of the diode 4 is recovered to the dc power source 1. This interval ends at an instant t6 when the charge remaining in the vicinity of the junction of the charge storage diode 4 is reduced to zero.

FIG. 3 shows a (snubber) power recovery rate (percentage) with respect to a ratio of a carrier lifetime of the charge storage diode 4 to the switching period (or cycle time) T. The power recovery rate is a ratio of the forward current and the reverse current in the charge storage diode 4.

As the carrier lifetime of the charge storage diode 4 becomes shorter than the time length corresponding to the switching period T, the power recovery rate decreases sharply, so that the unrecovered energy of the first capacitor 5 with respect to the output power is increased excessively. This makes the withstand voltages of the first capacitor 5 and the switching device 3 high. When the discharge circuit 11 is arranged to discharge the energy of the first capacitor 5 to avoid the increase in withstand voltage, the power loss is increased.

Therefore, the system according to this embodiment employs, as the charge storage diode 4, a diode having a long lifetime equal to or longer than the switching period in order to efficiently achieve the energy discharge from the first capacitor 5 by the reverse conduction of the charge storage diode 4.

When the carrier lifetime of the charge storage diode 4 is approximately equal to the switching period, the discharge circuit 11 can discharge the unrecovered energy in the first capacitor 5 with a very small power loss as compared with the output power, so that the conversion efficiency is not degraded.

Interval 6 (t6<t≦t7)

After the end of the reverse conduction of the charge storage diode 4 at the instant t6, the capacitor 12, the magnetizing inductance and leakage inductance of the transformer 2 and the inductance of the wiring form a resonant circuit, and the capacitor 12 is further discharged. It is possible to arrange the switching device 3 to turn on after the end of the reverse conduction of the first diode 4, without spoiling the advantageous effects of the present invention. In the present example, however, by appropriately choosing parameters (or constants), the circuit is designed to discharge the capacitor 12 to zero voltage level and to turn on the switching diode 3 when the anti-parallel diode 14 (the body diode in the case of MOSFET) becomes conductive. In this way, the zero volt switching operation is achieved. When the voltage V1 of the switching device 3 becomes equal to the voltage of the dc power source 1, the voltage of the transformer 2 becomes approximately equal to zero, the rectifying diode 6 conducts, and the secondary winding of the transformer 2 is short-circuited by the rectifying diode 6 and the flywheel diode 7 at an instant t7.

Interval 7 (t7<t≦t10)

The voltage of the capacitor 12 decreases by further discharge through the resonant circuit of the leakage inductance of the transformer 2, the wiring inductance, and the capacitor 12. When the voltage of the capacitor 12 is reduced to zero, the semiconductor switching device 3 turns on at an instant t8. Since the rectifying diode 6 is conducting, and the secondary of the transformer 2 is short-circuited, the leakage inductance of the transformer 2 bears most of the dc source voltage Ei, and the current increases linearly in the forward direction. Because of the leakage inductance of the transformer 2 being small, the currents of the switching device 3 and the rectifying diode 6 increase rapidly. When the current of the rectifying diode 6 becomes equal to the current of the inductor 8 at an instant t9, the flywheel diode 7 is reverse-biased and turns to the non-conducting state. When the flywheel diode 7 becomes non-conducting, a voltage appears at the secondary winding of the transformer 2, and this secondary voltage is the voltage transformed from the voltage Ei of the dc source 1 according to the turn ratio of the transformer 2. Thus, the energy is transferred from the dc power source 1 to the secondary side of the transformer 2 through the semiconductor switching device 3, the transformer 2, and the rectifying diode 6. This interval continues until the switching device 3 turns off at an instant t10.

Thereafter, the system returns to the operation of the interval 1, and repeats the cycle of the above mentioned operations. FIG. 2 shows waveforms at various portions of the circuit of FIG. 1.

When the charge storage diode 4 has a long carrier lifetime sufficiently longer than the switching period, the power charged in the first capacitor 5 is discharged nearly 100%. Therefore, it is possible to omit the discharge circuit 11 by using a diode having a large leak current as the charge storage diode 4.

Figure 4:
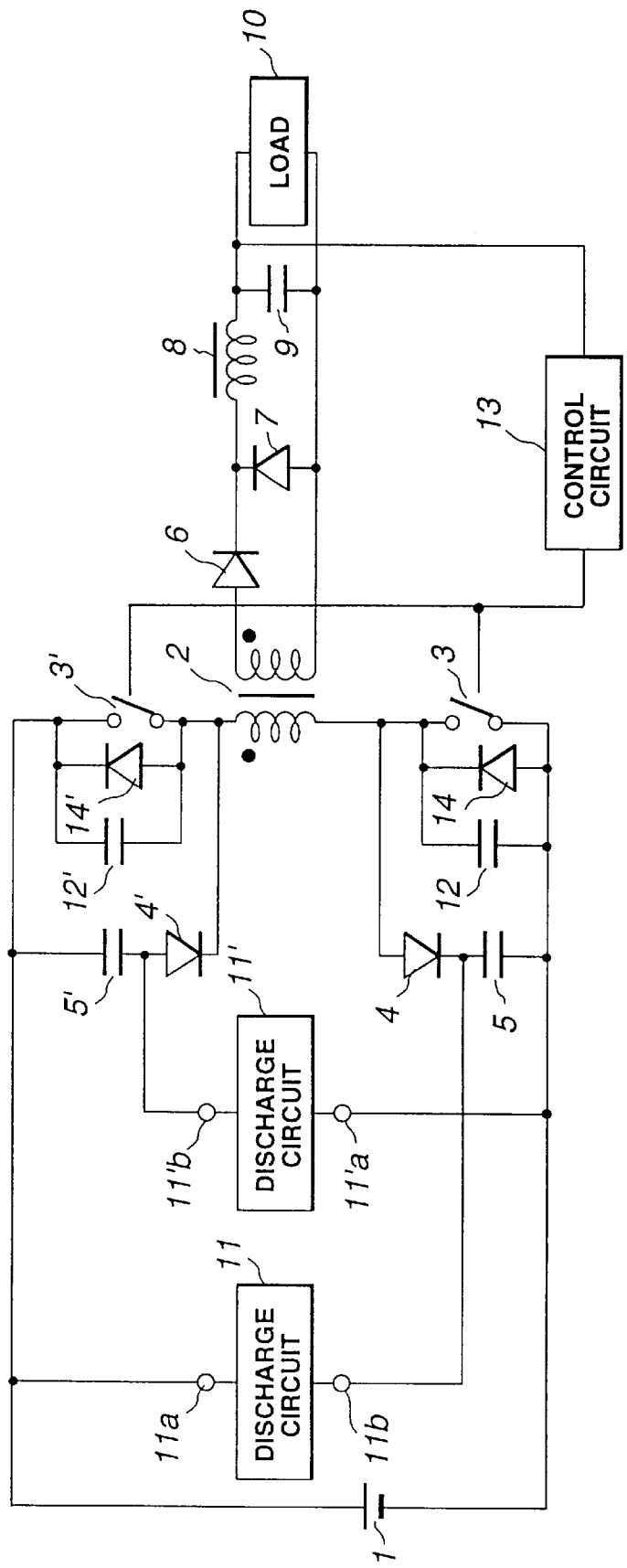
FIG. 4 is a diagram of a switching power supply system according to a second embodiment of the present invention.

FIG. 4 shows a second embodiment of the present invention. The circuit shown in FIG. 4 is a push-pull type forward converter. The circuit of FIG. 4 has a first circuit section including a semiconductor switching device 3, a charge storage diode 4, a first capacitor 5, a discharge circuit 11, a second capacitor 12 and an anti-parallel diode 14, like the circuit shown in FIG. 1. The circuit of FIG. 4 further includes a second circuit section similar to the first circuit section. The second circuit section of this example includes a semiconductor switching device 3', a charge storage diode 4', a voltage clamping capacitor 5', a discharge circuit 11', a second capacitor' 12 and an anti-parallel diode 14'.

The first diode 4' and the first capacitor 5' are connected in series to form a series combination. The first diode 4 has a cathode connected to the first end of the primary winding of the transformer 2, and an anode connected to a second end of the capacitor 5'. The switching device 3' has a first terminal connected to the positive terminal of the dc power source 1, and a second terminal connected to the first end of the primary winding of the transformer 2. The capacitor 5' has the first end connected to the first terminal of the switching device 3' and a second end connected to the anode of the diode 4'.

The control circuit 13 is connected to the gate (or control electrode) of the semiconductor switching device (or transistor) 3'. The discharge circuit 11' has a first end 11' connected to the negative terminal (or second terminal) of the dc power source 1, and a second end 11'b connected to a branch point between the anode of the charge storage capacitor 4' and the second end of the second capacitor 5'.

The charge storage diode 4 of the first circuit section has a carrier lifetime equal to or longer than the switching period of the semiconductor switching device 3, as in the first embodiment. Similarly the charge storage diode 4' of the second circuit section has a carrier lifetime equal to or longer than the switching period of the semiconductor switching device 3'. The operations of the circuit of FIG. 4 are basically the same as the operations of FIG. 1.

Figure 5:
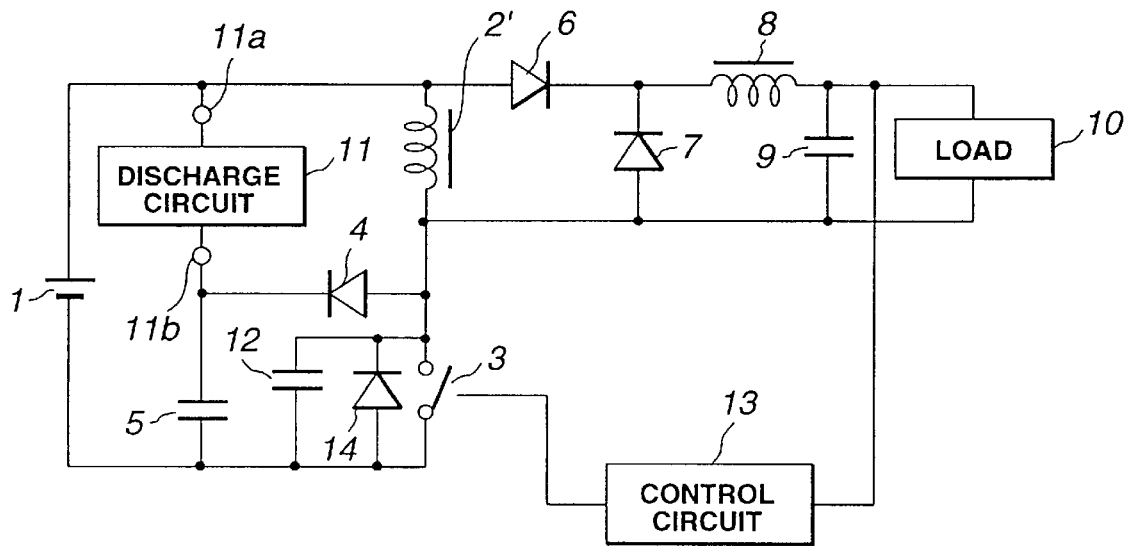
FIG. 5 is a diagram of a switching power supply system according to a third embodiment of the present invention.

FIG. 5 shows a third embodiment of the present invention. The circuit according to this embodiment is a non-isolating type switching power supply system in which the transformer 2 in the circuit of FIG. 1 is replaced by a resonant inductor 2' forming a resonant circuit with the second capacitor 12. The diode 4 has a long carrier lifetime equal to or longer than the switching period of the semiconductor switching device 3 as in the preceding embodiments. The operations of the circuit of FIG. 5 are basically the same as the operations of FIG. 1.

Figure 6:
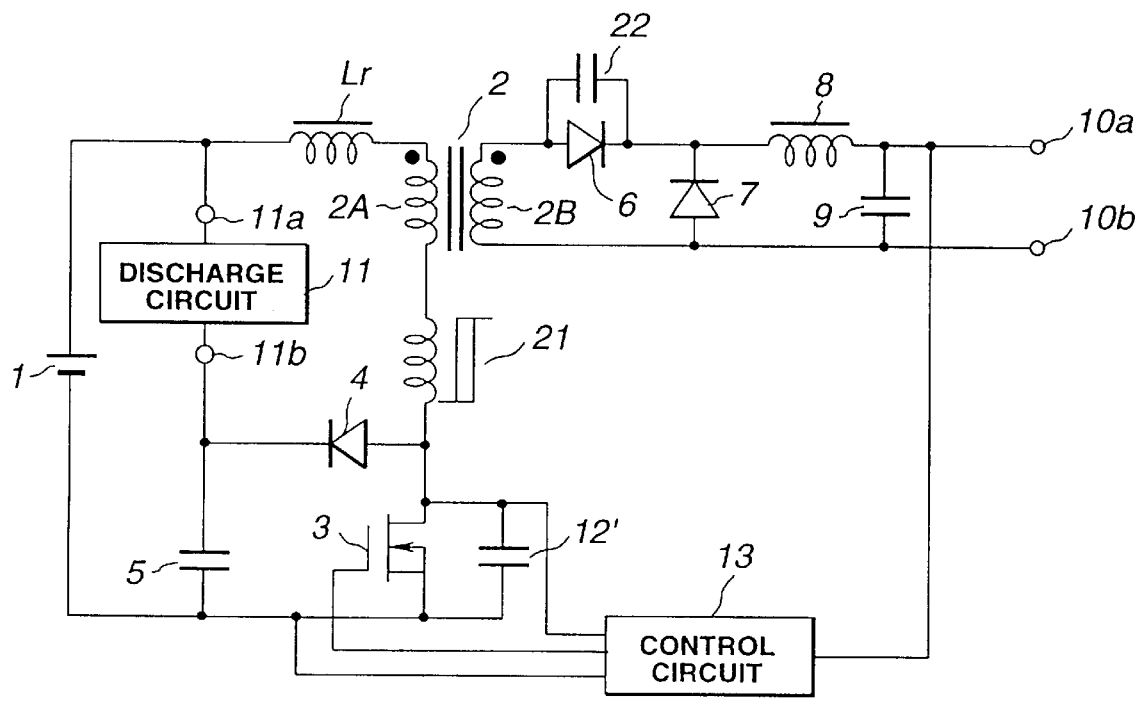
FIG. 6 is a diagram of a switching power supply system according to a fourth embodiment of the present invention.
Figure 17:
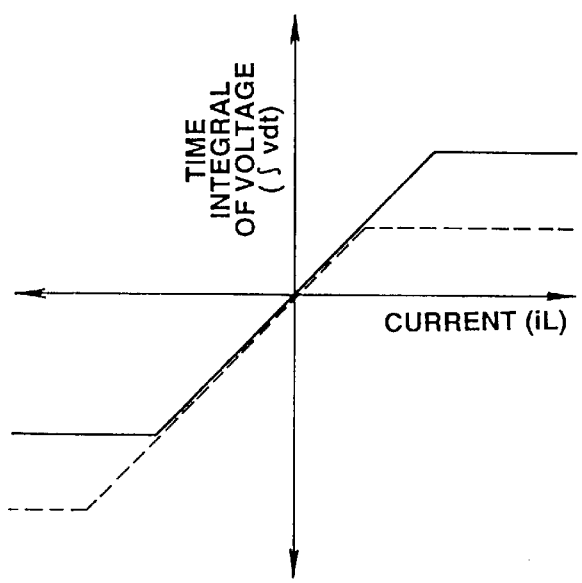
FIG. 17 is a graph showing a characteristic of a saturable inductor.

FIG. 6 shows a circuit configuration according to a fourth embodiment of the present invention. The circuit of FIG. 6 is a forward resonant converter. A resonance occurs at a frequency determined by the sum between an inductance Lr corresponding to the sum of the wiring inductance and the leakage inductance of the transformer 2, and a saturated inductance Lss of a saturable inductor 21 having a characteristic as shown in FIG. 17; and a resultant capacitance of the resonant capacitor 12' and the voltage clamping capacitor 5. The saturable inductor 21 has a predetermined inductance in a small power range, and decreases the inductance by magnetic saturation when a predetermined integral of voltage is applied.

The control circuit 13 delivers a control signal to the semiconductor switching device 3 after the reverse conduction of the diode 4 terminates or when the voltage of the switching device 3 is reduced to zero. Furthermore, the control circuit 13 detects an output operating variable such as a dc output voltage between dc output terminals 10a and 10b, or an output current or an output power, and controls the switching device 3 with the control signal so as to control the output operating variable at a predetermined value. The control circuit 13 is arranged to control the switching device 3 with the control signal by performing any one, or a combination of any two or more, of the on period control, the off period control, the turn-on timing control, and the on period control by the current mode control in which the main current value is involved.

Figure 7:
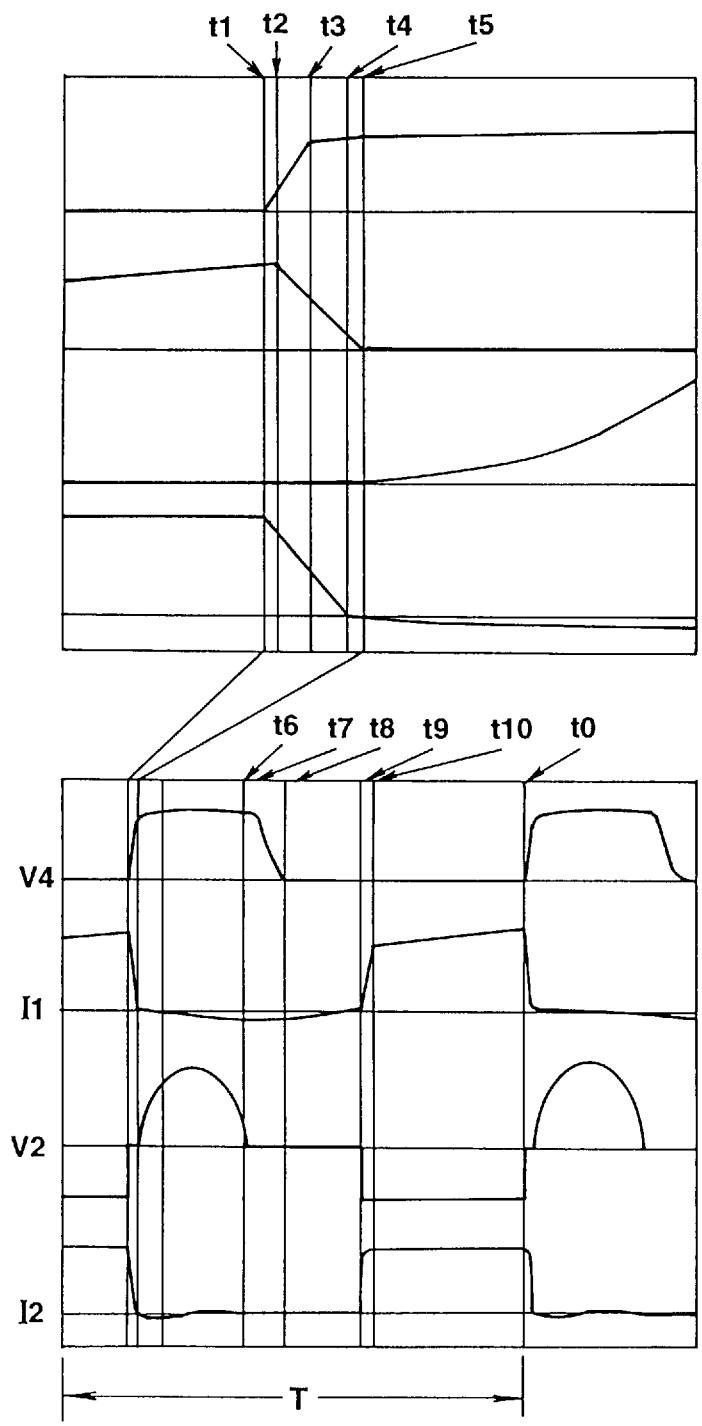
FIG. 7 is a diagram showing waveforms at various points in the circuit of FIG. 6 within a switching period T.

FIG. 7 shows a typical operating mode designed to hold the output voltage at a constant value. In the following explanation, the saturable inductor 21 is said to saturate at a predetermined current value. To be exact, the saturable inductor 21 reaches magnetic saturation in accordance with the time integral of the applied voltage. In a steady state operation, there exists a current value corresponding to the time integral of the voltage. Therefore, the treatment as explained below is possible by considering the current value as apparent saturation current.

In FIG. 7, V4 is the voltage across the semiconductor switching device 3, that is the voltage across the resonant capacitor 12, I1 and I2 are primary and secondary currents of the primary winding 2A and the secondary winding 2B of the transformer 2, respectively, and V2 is the voltage across the secondary winding 2B of the transformer 2.

Interval 1 (t0<t≦t1)

The semiconductor switching device 3 is in the on state, and the saturable inductor 21 is in the saturated state. The current flowing through the switching device 3 is equal to the sum of the primary side current corresponding to the current of the inductor 8 on the secondary side, and the magnetizing current of the transformer 2.

Interval 2 (t1<t≦t2)

At an instant t1, the semiconductor switching device 3 is turned off. The current ceases to flow through the switching device 3 and instead flows into the resonant capacitor 12'. Therefore, the capacitor 12' is charged, and the voltage V4 across the capacitor 12' increases sharply. At the time when the voltage V4 becomes equal to the voltage V1 of the dc power source 1, the voltage applied to the winding of the transformer 2 reduces to zero. During this, the voltage V4 across the resonant capacitor 12' increases substantially in a linear manner. As an inductor for dc smoothing, the inductor 8 normally has a sufficiently great value, and its current remains approximately constant during this. The magnetizing current of the transformer 2 changes only slightly. Therefore, the charging current of the resonant capacitor 12' is approximately constant, and the increase in the voltage V4 is substantially linear. When the winding voltage of the transformer 2 becomes equal to zero, the flywheeling diode 7 turns from the reverse biased state by the voltage of the transformer 2, to the conducting state, and the flywheeling diode 7 and the rectifying diode 6 puts the secondary winding 2B of the transformer 2 in the short-circuited state at an instant t2.

Interval 3 (t2<t≦3)

Because the secondary winding 2B of the transformer 2 is short-circuited at the instant t2, the magnetizing current of the transformer 2 is held approximately constant during this interval. As the flywheel diode 7 starts conducting, the load current starts flowing through the flywheel diode 7, and the charging current flowing into the resonant capacitor 12' starts decreasing. However, the current through the capacitor 12' does not immediately reduce to zero because of the existence of the inductance Lr corresponding to the wiring inductance and the leakage inductance of the transformer 2 and the saturation inductance Lss of the saturable inductor 21. (Lss is equal to or lower than the level of Lr.) Due to the resonance determined by the sum of these inductances and the resonant capacitor 12', the voltage V4 across the resonant capacitor 12' continues increasing. When the voltage V4 reaches the voltage V5 of the voltage clamping capacitor 5, the first diode 4 starts conducting in the forward direction at an instant t3.

Interval 4 (t3<t≦t4)

With the forward conduction of the first diode 4 from the instant t3, the resonance determined by the sum of the inductance Lr and the saturated inductance Lss of the saturable inductor 21, and the sum of the capacitances of the resonant capacitor 12' and the voltage clamping capacitor 5 causes the voltages of the resonant capacitor 12' and the voltage clamping capacitor 5 increase, and the charging current decreases. The resonant current flows through the diode 4, and charges are stored in the vicinity of the junction of the diode 4. The voltage waveforms of the resonant capacitor 12' and the voltage clamping capacitor 5 are determined mostly by the magnetizing inductance Lm of the transformer 2 and the capacitance of the voltage clamping capacitor 5. Therefore, it is desirable to set the capacitance of the voltage clamping capacitor 5 at a sufficiently high value to reduce the dependency on time. In order to reduce changes in the voltage of the semiconductor switching device 3 during this interval, the voltage clamping capacitor 5 is required to have a sufficiently large capacitance. When the charging currents of the resonant capacitor 12' and the voltage clamping capacitor 5 decrease to the value of the magnetizing current of the transformer 2, the rectifying diode 6 turns off and the short circuit of the secondary winding 2B of the transformer 2 is canceled at an instant t4.

Interval 5 (t4<t≦t5)

When the rectifying diode 6 turns off and terminates the short-circuited state of the secondary winding 2B of the transformer 2 at the instant t4, the magnetizing inductance Lm of the transformer 2, the saturation inductance Lss of the saturable inductor 21, the resonant capacitor 12', the voltage clamping capacitor 5, the secondary side's resonant capacitor 22 and the inductance Lr form a resonant circuit. With the resonance, the voltages of the resonant capacitor 12', the voltage clamping capacitor 5 and the secondary side resonant capacitor 22 vary.

Then, when the current of the saturable inductor 21 decreases to the magnetic saturation current, the saturable inductor 21 turns away from the magnetic saturation and the inductance of the saturable inductor 21 increases to a unsaturated inductance Lsn which is as great as the level of the magnetizing inductance of the transformer 2. The saturable inductor 21 turns from the saturation to the unsaturation at an instant t5.

Interval 6 (t5<t≦t6)

When the saturable inductor 21 gets out of the magnetic saturation at the instant t5, the magnetizing inductance Lm of the transformer 2, the unsaturated inductance Lsn of the saturable inductor 21, the resonant capacitor 12', the voltage clamp capacitor 5, the secondary side resonant capacitor 22, the inductance of the wiring and the leakage inductance Lr of the transformer 2 form a resonant circuit, and resonates. With the resonance, the resonant capacitors 12' and 22, and the voltage clamping capacitor 5 are charged and the their voltages increase.

When the resonant energy of the magnetizing inductance Lm of the transformer 2, the unsaturated inductance Lsn of the saturable inductor 21 and the inductance Lr is all transferred to the primary side resonant capacitor 12', the voltage clamp capacitor 5 and the secondary side capacitor 22, the charge storage diode 4 turns to the reverse conduction state by charges accumulated in the vicinity of the junction during the forward conduction period. Furthermore, the magnetizing inductance Lm of the transformer 2, the unsaturated inductance Lsn of the saturable inductor 21, the resonant capacitor 12', the voltage clamping capacitor 5, the secondary side resonant capacitor 22, the inductance of the wiring, and the leakage inductance Lr of the transformer 2 form a resonant circuit. With the resonance of this resonant circuit, the resonant capacitors 12' and 22, and the voltage clamping capacitor 5 are discharged, and the voltages increase.

When the resonant capacitor 22 connected in parallel to the rectifying diode 6 is charged and discharged and the voltage reduces to zero, the rectifying diode 6 turns to the conducting state, and the rectifying diode 6 and the flywheel diode 7 short-circuit the secondary winding 2B of the transformer 2 at an instant t6.

Interval 7 (t6<t≦t7)

When the short-circuited state of the secondary winding of the transformer 2 starts at the instant t6, the unsaturated inductance Lsn, the resonant capacitor 12', the voltage clamping capacitor 5, and the inductance Lr form a resonant circuit. With the resonance of this resonant circuit, the resonant capacitor 12' and the voltage clamping capacitor 5 are further discharged. By the energy stored in the unsaturated inductance of the saturable inductor 21 until the instant t6 as current in the discharging direction of the resonant capacitor 12' and the voltage clamping capacitor 5, the resonant capacitor 12' and the voltage clamping capacitor 5 continue discharging. The reverse conduction state of the charge storage diode 4 ends at an instant t7 when the charge stored around the junction reduce to zero.

Interval 8 (t7<t≦t8)

When the reverse conduction of the charge storage diode 4 ends at the instant t7, the unsaturated inductance Lsn of the saturable inductor 21, the resonant capacitor 12', and the inductance Lr corresponding to the sum of the inductance of the wiring and the leakage inductance of the transformer 2 form a resonant circuit. By the energy stored in the unsaturated inductance of the saturable inductor 21 until the instant t6 as current in the discharging direction of the resonant capacitor 12', the resonant capacitor 12' continues discharging.

When the voltage of the resonant capacitor 12' reduces to zero, the body drain diode of the semiconductor switching device 3(or the diode connected in anti-parallel to the switching device 3 in the case of the switching device being not a FET) turns to the conducting state at an instant t8.

Interval 9 (t8<t≦t9)

During the conducting period of the body diode of the semiconductor switching device 3 or the anti-parallel diode of the semiconductor switching device 3, the switching device 3 is turned on. In this way, this system can turn on the switching device 3 in the state in which the applied voltage is zero. In this operating mode, the rectifying diode 6 is in the conducting state and the secondary winding of the transformer 2 is in the short-circuited state from the instant t5. Therefore, the saturable inductor 21 bears most of the dc source voltage V1, the current increases linearly in the forward direction, and the saturable inductor 21 reaches the magnetic saturation at an instant t9 when the current increases to the saturation current value. During this, the power is not supplied to the output. However, the magnetic flux of the transformer 2 does no vary because of the short-circuited state of the secondary winding 2B.

Interval 10 (t9<t≦t10)

With the magnetic saturation of the saturable inductor 21 at the instant t9, all of the voltage V1 of the dc power source 1 is borne by the inductance Lr corresponding to the wiring inductance and the leakage inductance of the transformer 2, and the saturated inductance Lss of the saturable inductor 21. Since this resultant inductance is small, the currents of the semiconductor switching device 3 and the rectifying diode 6 increase sharply. When the current of the rectifying diode 6 becomes equal to the current of the inductor 8 at an instant t10, the flywheel diode 7 is reverse-biased to the off state. Upon turn-off of the flywheel diode 7, there appears, at the secondary winding 2B of the transformer 2, a voltage determined by the source voltage V1 of the source 1, and the turn ratio of the transformer 2. Thus, the power is supplied from the dc power source 1 through the switching device 3, the transformer 2 and the rectifying diode 6 to the secondary side.

Thereafter, the system returns to the operation of the interval 1, and repeats the cycle. FIG. 7 shows waveforms at various positions of the circuit of FIG. 6. When the system employs one or more circuit components having a different constant, the operations of the system may be slightly different from the above-mentioned example, in the order of operations or some other respects. However, the charge storage diode 4 having a long lifetime works substantially in the same manner in the resonant type forward converter.

When the resonant type forward converter circuit employs the charge storage diode 4 whose carrier lifetime is sufficiently longer than the switching period (or switching cycle time) T, the energy transferred from the magnetizing inductance Lm of the transformer 2, the unsaturated inductance Lsn of the saturable inductor 21, and the inductance Lr corresponding to the sum of the wiring inductance and the leakage inductance of the transformer 2 to the voltage clamping capacitor 5 is almost entirely recycled through the magnetizing inductance Lm of the transformer 2, the unsaturated inductance Lsn of the saturable inductor 21 and the inductance Lr, to the dc power source 1. Therefore, the system can eliminate the discharge circuit 11 by employing, as the charge storage diode 4, a diode having a high leak current.

In the example in which the lifetime of the diode 4 is about the level of the switching period, the loss in the discharge circuit 11 is very small even if unrecovered energy in the voltage clamping capacitor 5 is discharged. Therefore, it is possible to achieve the above mentioned operations without deteriorating the conversion efficiency.

The circuit according to this embodiment can performed the turn-on and turn-off operations of the switching device 3 and the rectifying diode 6 at the zero voltage level without the necessity of increasing the voltage of the resonant capacitor 12' as in the conventional example. Furthermore, irrespective of the conversion frequency, this embodiment makes it possible to omit the resonant capacitor 12' and to satisfy the resonance capacitance only by the output capacitance comprising the junction capacitance (or barrier capacitance) of the semiconductor switching device 3.

Therefore, the resonant current in the circuit of this embodiment is as low as the magnetizing current of the transformer in the conventional non-resonant type forward converter, and the current of the switching device 3, the winding currents of the transformer 2, and the current of the rectifying diode are at low levels as in the conventional non-resonant forward converter. This embodiment can provide a high frequency, high efficiency converter without increasing the circuit current to achieve the zero voltage switching operation in a wide range of load current, and without increasing the voltage of the semiconductor switching device 3.

Figure 8:
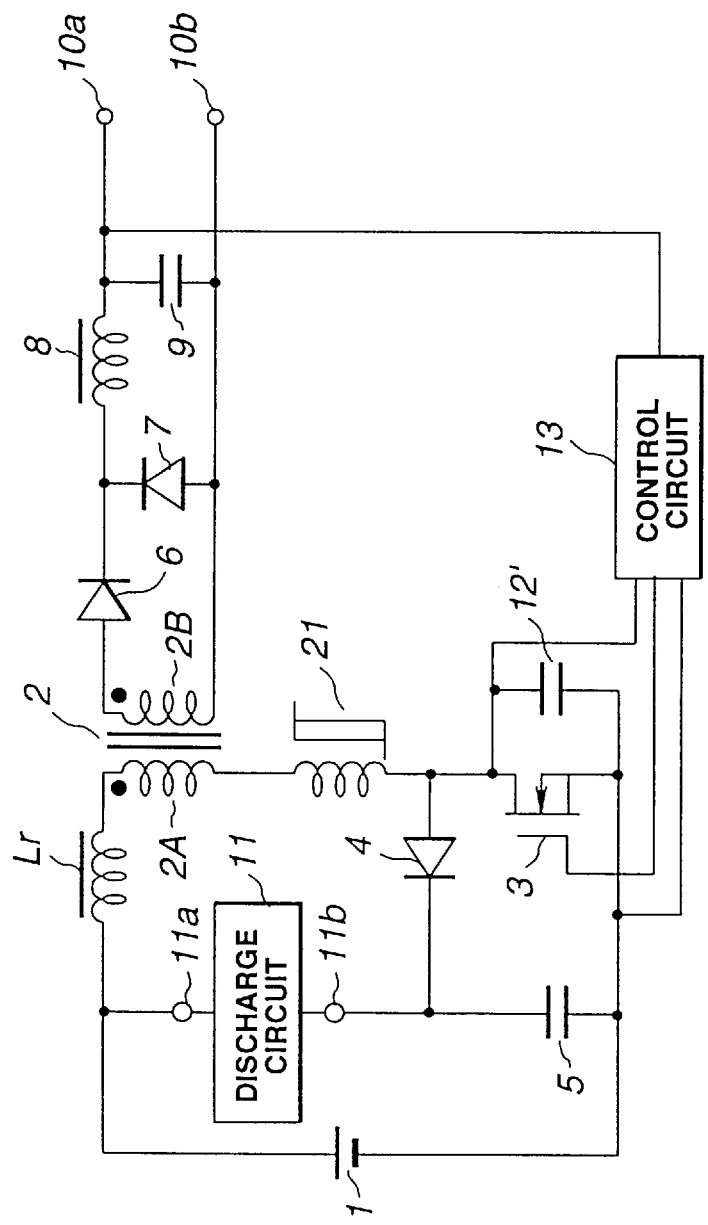
FIG. 8 is a diagram of a switching power supply system according to a fifth embodiment of the present invention.

FIG. 8 shows a fifth embodiment of the present invention. In this embodiment, the resonant capacitor 22 shown in FIG. 6 is omitted, and the rectifying diode 6 is arranged to turn off at a non-zero voltage level. In the other respects, the circuit of FIG. 8 is substantially the same as the circuit of FIG. 6. The system of the fifth embodiment can operate at a sufficiently high conversion frequency by using the rectifying diode 6 having a small junction capacitance, and the switching device 3 switching at the zero voltage level. Unlike the example of FIG. 1, the circuit of FIG. 8 does not utilize the resonant on the secondary side. However, the circuit of FIG. 8 is operated substantially in the same manner as the circuit of FIG. 6. Specifically, the circuit of FIG. 8 can implement the zero voltage switching of the primary side semiconductor switching device without increasing the voltage of the resonant capacitor as in the preceding example.

Figure 9:
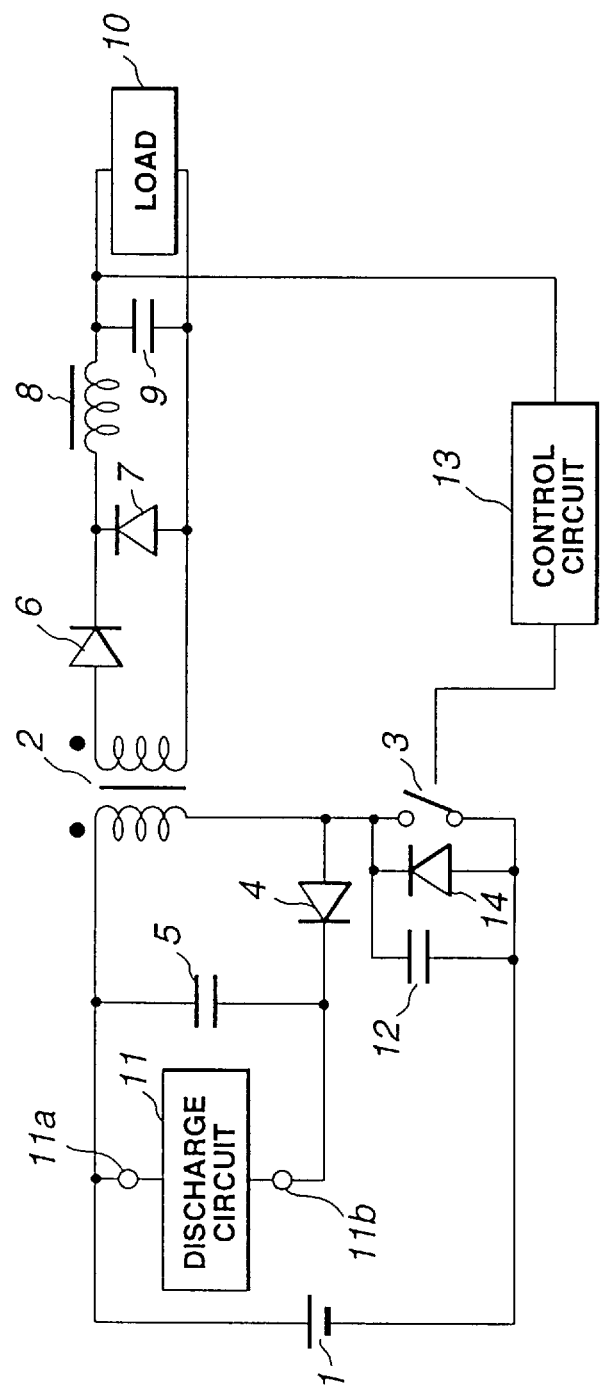
FIG. 9 is a diagram of a switching power supply system according to a sixth embodiment of the present invention.
Figure 10:
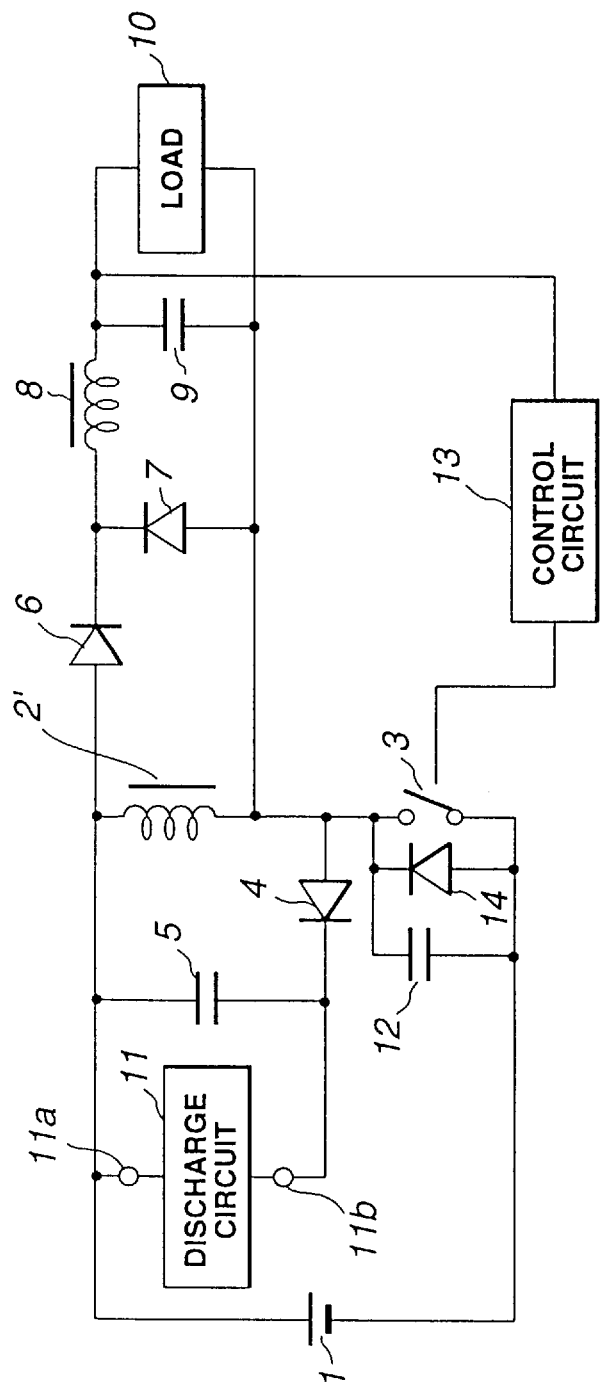
FIG. 10 is a diagram of a switching power supply system according to a seventh embodiment of the present invention.

FIGS. 9 and 10 show sixth and seventh embodiments according to the present invention. In these embodiments, the series circuit of the charge storage diode 4 and the voltage clamp 5 is connected in parallel to the inductance of the inductive component (2 or 2').

The circuit of FIG. 9 is different from the circuit of FIG. 1 in that the series combination of the charge storage diode 4 and the voltage clamping capacitor 5 of FIG. 9 is connected in parallel with the primary winding of the transformer 2. In FIG. 9, the voltage clamping capacitor 5 is in parallel to the discharge circuit 11. The circuit configuration of FIG. 9 is substantially equivalent to the circuit of FIG. 1 in the capability of ensuring the resetting operation of the transformer 2.

The circuit of FIG. 10 is different from the circuit of FIG. 5 in that the series combination of the charge storage diode 4 and the voltage clamping capacitor 5 of FIG. 10 is connected in parallel with the resonant inductor 2'. In FIG. 10, the voltage clamping capacitor 5 is in parallel to the discharge circuit 11.

As in the preceding examples, the charge storage diode 4 has a long carrier lifetime equal to or longer than a time length corresponding to the switching period of the semiconductor switching device 3.

The basic operations of the circuit of FIG. 9 are substantially the same as those of FIG. 1. The basic operations of the circuit of FIG. 10 are substantially the same as those of FIG. 5.

FIGS. 11A, 11B, 11C and 11D show four examples of the discharge circuit 11 according to the present invention.

Figure 11:
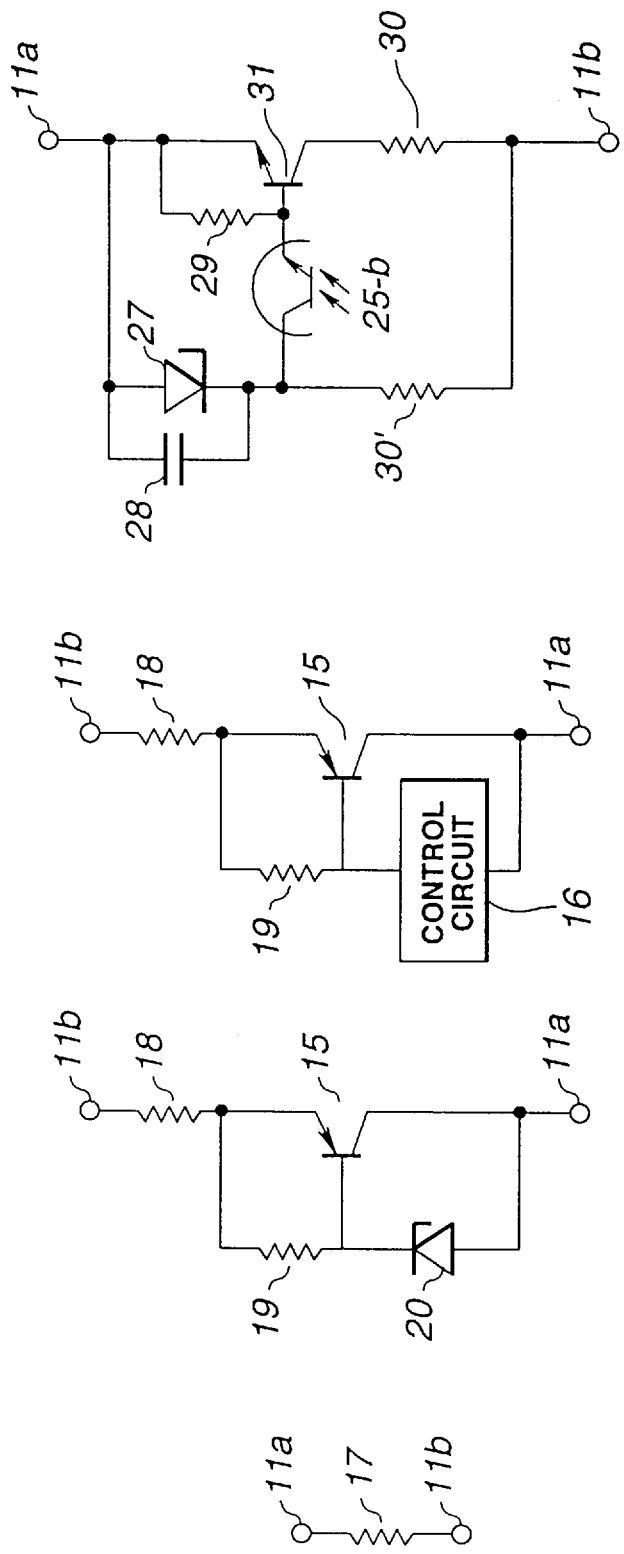
FIGS. 11A, 11B, 11C and 11D are diagrams showing four examples of a discharge circuit which can be employed in the present invention.

The discharge circuit 11 of FIG. 11A includes only a resistor 17 connected between the first and second terminals 11a and 11b of the discharge circuit 11. The discharge circuit 11 of FIG. 11A is arranged to return the energy of the first capacitor 5 which has not been recycled in the reverse conduction period of the charge storage diode 4, while the resistor 17 partially consumes the power. This example makes effective use of a long lifetime diode as the charge storage diode 4, and prevents the conversion efficiency from being made poor.

The discharge circuit 11 of FIG. 11B includes a PNP transistor 15, first and second resistors 18 and 19, and a zener diode 20. The collector of the PNP transistor 15 and the anode of the zener diode 20 are connected together to the first terminal 11a. The resistor 18 is between the second terminal 11b of the discharge circuit 11 and the emitter of the PNP transistor 15. The zener diode 20 is between the collector and base of the PNP transistor 15, and the second resistor 19 is between the base and emitter of the PNP transistor 15. In this discharge circuit 11, current flows from the second terminal 11b to the first terminal 11a so that the voltage between the collector and emitter of the transistor 15 becomes equal to the voltage of the zener diode 20, and the voltage between these terminals becomes equal to the sum of the voltage of the zener diode 20 and the voltage drop across the resistor 18. When employed in the circuit of FIG. 1, the discharge circuit of FIG. 11B operates so as to make the voltage of the first capacitor 5 approximately equal to the sum of the voltage of the zener diode 20 and the voltage drop of the resistor 18. Therefore, the peak voltage of the semiconductor switching device 3 is clamped by the voltage which is equal to the sum of the voltage of the zener diode 20, the voltage drop of the resistor 18 and the voltage Ei of the dc power source 1.

In the example of FIG. 11B, the voltage of the first capacitor 5 remains stable irrespective of an abrupt change in load or input voltage. Therefore, the configuration of FIG. 11B enables a high speed control of an open loop transfer characteristic irrespective of the first diode 5.

In the example of FIG. 11C, the zener diode 20 in the circuit of FIG. 11B is replaced by a control circuit 16. In the other respects, the circuit of FIG. 11B is substantially identical in construction and operations to the circuit of FIG. 11B. The control circuit 16 is configured to control the voltage of the transistor 15. When employed in the circuit of FIG. 1, the discharge circuit of FIG. 11C makes it possible to control the peak voltage value of the semiconductor switching device 3 in accordance with changes in the current of the load circuit 10 and the voltage Ei of the dc power source 1, and to minimize the peak voltage of the semiconductor switching device 3 even when the ranges of the input voltage and load current are wide.

If a diode having a carrier lifetime shorter than the switching period is employed as the charge storage diode 4, electrons and holes recombine quickly in the charge storage diode 4 and the period of the reverse conduction is brief. Therefore, the short carrier lifetime diode results in a decrease of the amount of energy recycled from the first capacitor 5 to the dc power source 1 through the charge storage diode 4 in the reverse conduction state during the turn-off period of the switching device 3. The discharge circuit 11 must discharge a large amount of power stored and left unrecycled in the first capacitor 5, so that the short carrier lifetime diode increases the loss in the discharge circuit 11, and increases the required current carrying capacity of components of the discharge circuit 11. To decrease the discharge power of the discharge circuit 11, the first capacitor 5 and the semiconductor switching device 3 are required to have a higher withstand voltage.

As explained above, the system according to the present invention can accumulate, in the first capacitor 5 during the off period of the semiconductor switching device 3, most of the energy stored in the magnetizing inductance of the transformer 2, the leakage inductance, and the wiring inductance during the on period of the semiconductor switching device 3, with little consumption, and return most of the energy to dc power source 1 by recirculation through the magnetizing inductance of the transformer 2, the leakage inductance and the wiring inductance. Furthermore, the turn-on operation at the zero voltage is possible with appropriately selected circuit constants. By deferring the turn-on of the switching device 3 until the end of the reverse conduction of the charge storage diode 4, the system can reduce noise and loss due to the reverse conduction of the charge storage diode 4.

Figure 13:
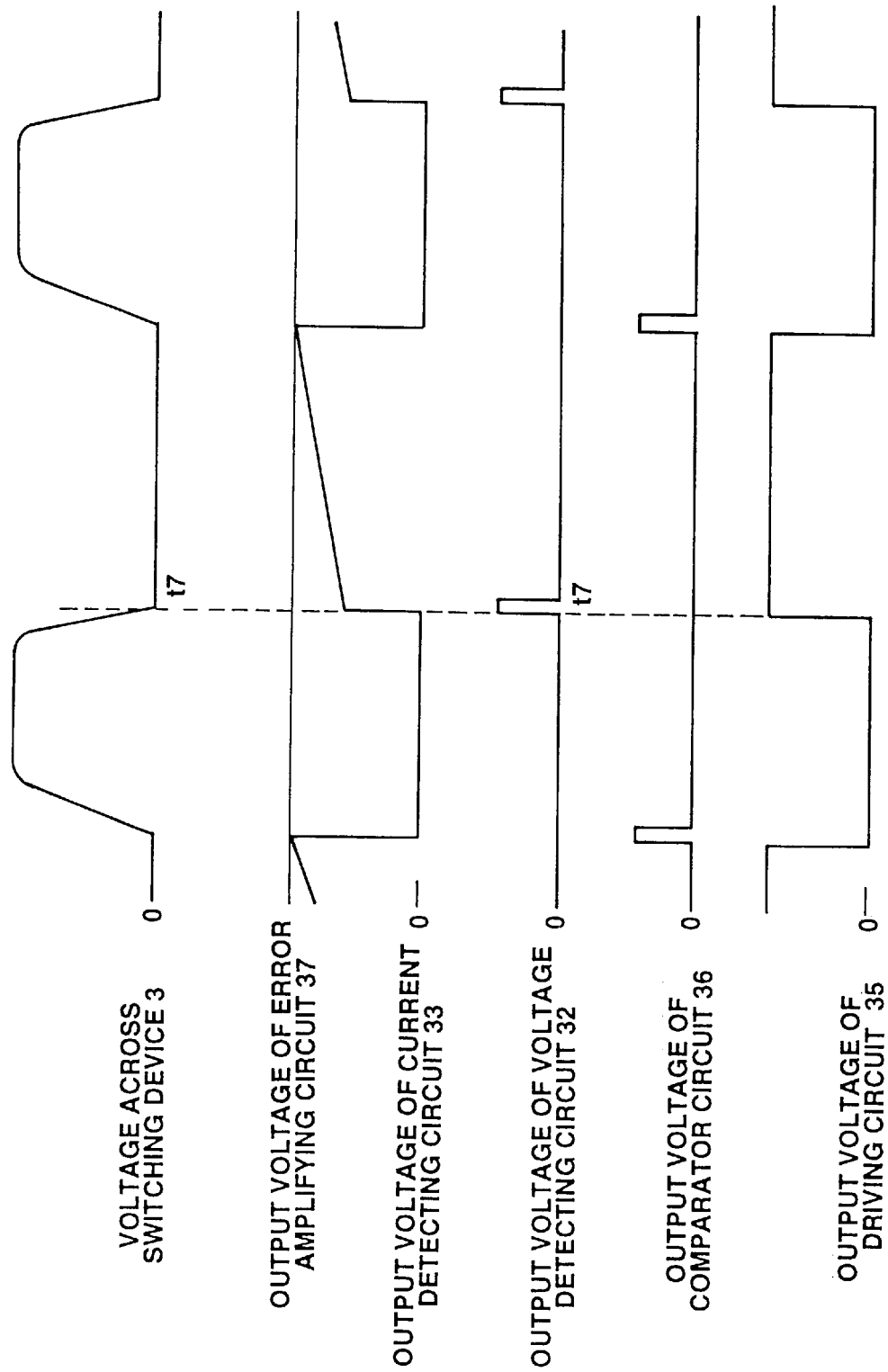
FIG. 13 is a diagram showing waveforms at various points in the circuit of FIG. 12.
Figure 14:
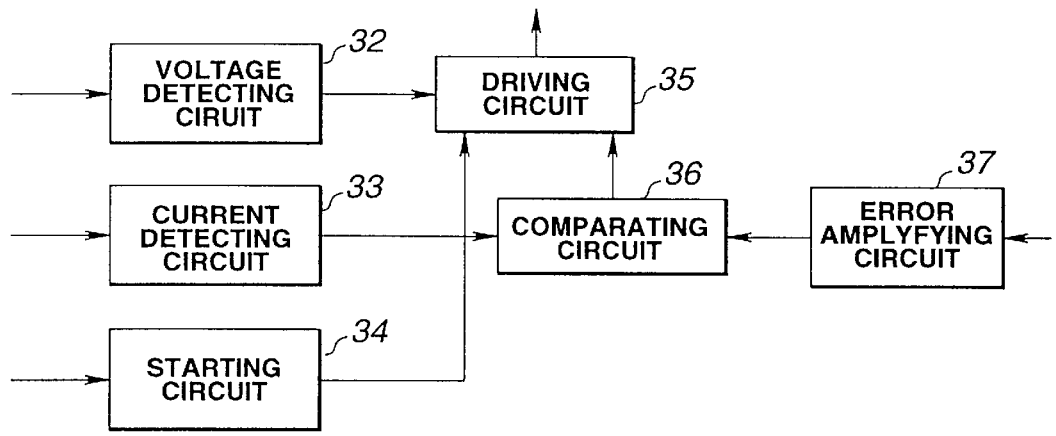
FIG. 14 is a diagram schematically showing a conventional control circuit.

If the system employs the discharge circuit 11 of FIG. 11A, and a conventional control circuit as shown in FIG. 14, the switching power supply system encounters an undesirable wide fluctuation of the conversion frequency of the switching power supply system. This problem is illustrated by using FIG. 13, which shows waveforms at instants shown in FIG. 2.

At the time t7 in FIG. 13, a voltage detecting circuit 32 shown in FIG. 14 detects the voltage across the semiconductor switching device 3 reaching a zero voltage or a minimum voltage, and delivers a detection signal to a drive circuit 35, and the drive circuit 35 turns on the semiconductor switching device 3. An error amplifier 37 detects the output voltage of the switching power supply to control the output voltage at a constant level, and produces an error signal by amplifying an error voltage corresponding a deviation of the output voltage from the preset voltage. A current detecting circuit 33 detects the current of the semiconductor switching device 3 or the current of the diode 6. A comparator 36 compares a current detection signal supplied from the current detecting circuit 33 and the error signal of the error amplifier 37, and delivers a comparator output signal to the drive circuit 35 when the current detection signal becomes equal to or greater than the error signal. In response to the comparator output signal, the drive circuit 35 turns off the semiconductor switching device 3.

At a start of the system, the voltage of the semiconductor switching device 3 is equal to the input voltage, so that the voltage detecting circuit 32 is inoperative. Therefore, a starting circuit 34 produces a drive signal to drive the semiconductor switching device 3 in the starting operation. The starting circuit 34 monitors the input voltage and causes the drive circuit 35 to turn on the switching device 3 by sending a signal to the drive circuit 35 when the input voltage becomes equal to or higher than a preset voltage.

In this drive mode, the conversion frequency is determined by main circuit constants and input and output conditions, and the conversion frequency varies widely with changes in the input/output conditions. This increases the cost and size of the switching power supply because of the need for setting input and output filters in consideration of a lowest frequency, and for selecting circuit components in accordance with a highest frequency.

To avoid this problem, the discharge circuit 11 shown in FIG. 11D is designed to make the width of variation of the conversion frequency very narrow notwithstanding changes in the input and output conditions. The discharge circuit 11 of FIG. 11D can be employed in a switching power supply system shown in FIG. 12 to control the amount of discharge current. In this case, the system can vary the off period of the switching device 3 so as to hold the conversion frequency constant by varying the voltage of the voltage clamping capacitor 5 and the voltage applied to the winding of the transformer 2.

This control method is based on the following notion. It is possible to control the voltage applied to the winding of the transformer 2 in the reset operation of the transformer 2 by controlling the voltage of the voltage clamping capacitor 5. This causes a variation in the gradient (or slope) of the reset current in the off period of the semiconductor switching device 3, and a variation in the time required to complete the reset operation, and eventually the conversion frequency varies.

Figure 12:
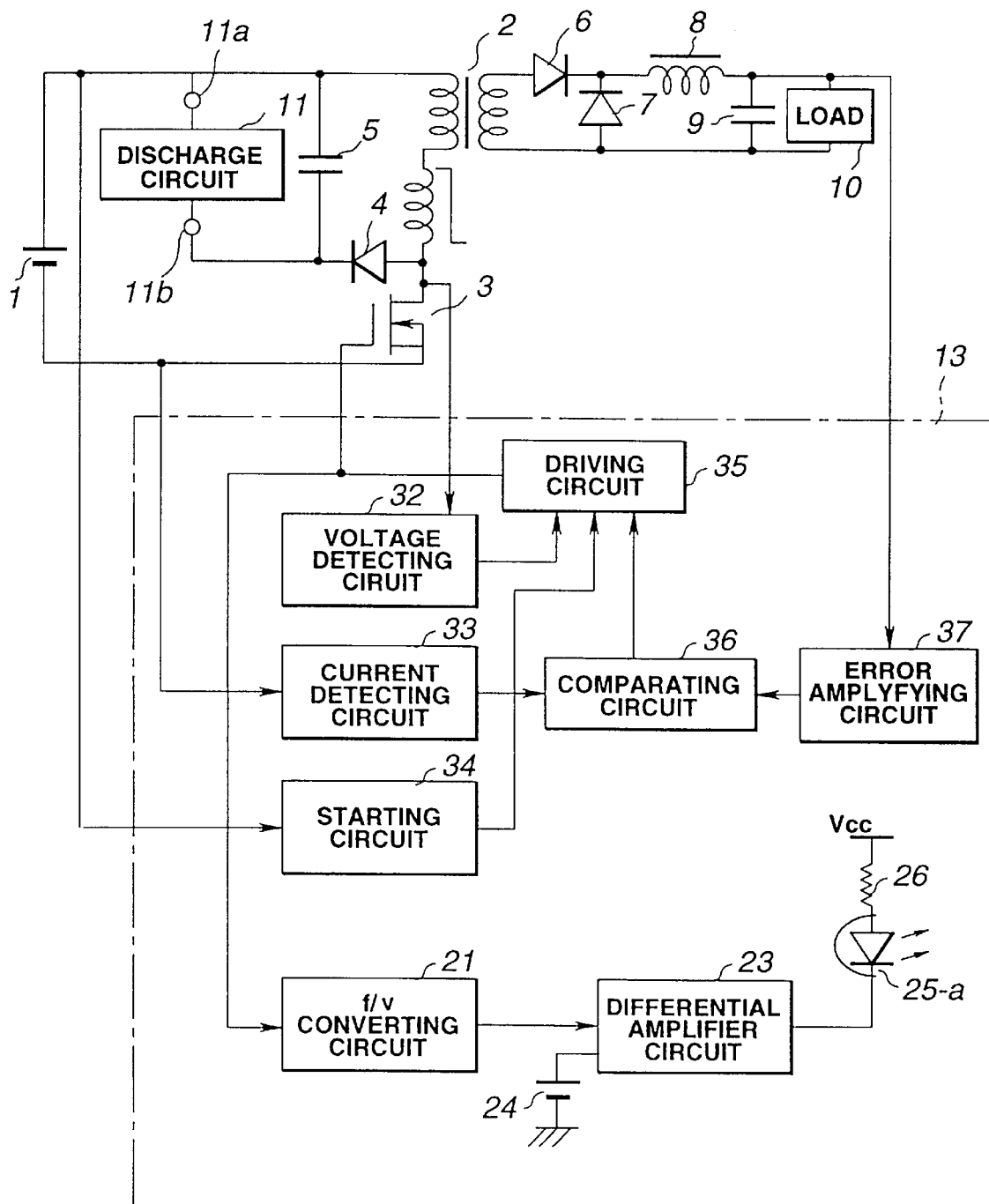
FIG. 12 is a diagram of a switching power supply system according to an eighth embodiment of the present invention.

In addition to the components of the conventional control circuit shown in FIG. 14, the control circuit 13 shown in FIG. 12 includes an f/v conversion circuit 21, an differential amplifier circuit 23, a reference voltage source 24, a photo-coupler (optical isolator) 25 and a resistor 26.

The f/v converting circuit 21 receives the drive signal supplied from the drive circuit 35 to the semiconductor switching device 3, and produces a dc voltage of a magnitude corresponding to the conversion frequency of the switching power supply system. The differential amplifying circuit (or error amplifying circuit) 23 receives this dc voltage signal from the frequency to voltage converting circuit 21 and a reference voltage from the reference voltage source 24, and produces an error signal by amplifying the difference therebetween to a desired level. This error signal is supplied to the base of the transistor 31 of the discharge circuit 11 shown in FIG. 11D, through a light emitting diode 25a and a light sensitive transistor 25b of the photocoupler 25.

The transistor 31 conducts a discharge current corresponding to the error signal, from the voltage clamping capacitor 5 toward the input power source 1. This discharge current is controlled to provide the preset conversion frequency. By this discharge current, the system controls the voltage of the voltage clamping capacitor 5, the voltage applied to the winding of the transformer 2, and the off period of the semiconductor switching device 3, and controls the conversion frequency substantially to a desired value.

This example fixes the conversion frequency at a constant level or minimizes the range of variation of the conversion frequency by employing the current mode control as in the conventional system, and the thus-constructed discharge circuit. It is possible, however, to provide the same effects by employing a voltage control mode.

In each of the illustrated examples, the switching power supply system is arranged to provide a dc output by rectifying the voltage on the secondary side of the transformer 2. However, the present invention is applicable to the switching power supply system for supplying an ac voltage to a load without means for rectifying the voltage of the secondary side of the transformer 2. In this case, the output voltage is detected, and the system requires a diode for rectifying the detected voltage signal as in the ordinary voltage detection circuit.

According to the present invention, as explained above, the series circuit of the long lifetime diode and the voltage clamp is connected in parallel to the semiconductor switching device or the inductive component. Therefore, the system can accumulate energy in the magnetizing inductance and leakage inductance of the inductive component during the on period of the switching device, transfer the energy to the voltage clamp during the off period of the switching device, and recirculate most of the energy through the magnetizing and leakage inductance of and wiring inductance. The system further enables the zero voltage switching on operation by selecting circuit components. The switching device does not turn on until the end of the reverse conduction period of the first diode. Therefore, the system reduces the noise and loss due to the reverse conduction of the first diode. These effects can be achieved without complicating the circuit configuration.

Furthermore, the system according to the present invention can achieve the desirable zero switching operation with the low current level as in the conventional non-resonance type forward converter and the semiconductor device of a considerably low withstand voltage, and reduce the power loss in the switching operation. The system according to the present invention can hold the switching frequency substantially constant independent of changes in the input voltage and load current. The system can secure the resetting operation of the transformer without the need for a reset switch as in the conventional system.

In the example of FIG. 6, the switching device 3 is a MOSFET, and the drain of the switching device 3 is connected to the saturable inductor 21, and the source is connected to the negative terminal of the dc power source 1.

The control signal sent from the control circuit 13 to the control terminal (such as the gate) of the semiconductor switching device 3 is a pulse width modulation signal (PWM signal), for example.

The switching period T of the switching power supply system is the reciprocal of the conversion frequency f (T=1/f).

The inductive component is a component having an inductance.

What is claimed is:

1. A switching power supply system comprising:
   a semiconductor switching device for selectively opening and closing a current path from a dc power source to a load;
   an inductive component connected in series with the switching device;
   a series combination of a first diode and a voltage clamp which are connected in series with each other, the series combination being connected in parallel to one of the switching device and the inductive component; and
   a control circuit for controlling the switching device;
   wherein the first diode has a carrier lifetime which is equal to or longer than a switching period of the switching device.

2. A power supply system according to claim 1 wherein the series combination is connected in parallel to the switching device.

3. A power supply system according to claim 1 wherein the series combination is connected in parallel to the inductive component.

4. A power supply system according to claim 1 wherein the voltage clamp comprises a capacitor.

5. A power supply system according to claim 1 wherein the voltage clamp comprises a battery for providing a dc output voltage higher than an output voltage of the dc power source.

6. A power supply system according to claim 1 wherein the semiconductor switching device comprises a MOSFET.

7. A power supply system according to claim 1 wherein the system further comprises a second diode connected in parallel to the switching device.

8. A power supply system according to claim 1 wherein the system further comprises a second capacitor connected in parallel to the switching device.

9. A power supply system according to claim 1 wherein the inductive component comprises a transformer comprising a primary winding connected in series with the switching device, and a secondary winding magnetically coupled to the primary winding.

10. A power supply system according to claim 1 wherein the system further comprises a discharge circuit for discharging energy remaining in the voltage clamp without being returned through the inductive component to the direct current power source during a reverse conduction period of the first diode, and the discharge circuit is connected between a first end of the direct current power source and a branch point between the voltage clamp and the first diode.

11. A power supply system according to claim 10 wherein the discharge circuit comprises a component for providing a variable impedance in accordance with a control signal for controlling the switching device.

12. A power supply system according to claim 1 wherein the control circuit is arranged to detect one of a first condition that exists when a reverse current of the first diode decreases to zero, and a second condition that exists when a voltage across the switching device decreases to a predetermined voltage which is one of a zero voltage and a minimum voltage, and to deliver a turn-on signal to the switching device after an end of a reverse conduction of the first diode.

13. A power supply system according to claim 9 wherein the power supply system further comprises a saturable inductor connected in series with the primary winding of the transformer, a resonant capacitor connected in parallel to the switching device, a rectifying diode connected in series with a first terminal of the secondary winding of the transformer, a flywheeling diode connected between the rectifying diode and a second terminal of the secondary winding of the transformer, and an output filter.

14. A power supply system according to claim 13 wherein the resonant capacitor is an output capacitance of the switching device.

15. A power supply system according to claim 13 wherein a resonant capacitance comprises an output capacitance of the switching device and a capacitance of the resonant capacitor connected in parallel to the switching device.

16. A control process for controlling a switching power supply system comprising a semiconductor switching device for periodically opening and closing a circuit for supplying power from a dc power source to a load, an inductive component connected in series with the switching device, a capacitive component connected across the switching device, a series combination of a first diode and a voltage clamp which are connected in series with each other, the series combination being connected in parallel to one of the switching device and the inductive component, and a control circuit for controlling the switching device, the control process comprising:

a first step for transferring energy stored in the inductive component during an on period of the semiconductor switching device, to the voltage clamp during an off period of the switching device by utilizing forward conduction of the first diode;

a second step for returning most of the energy stored in the voltage clamp through the inductive component to the dc power source by reverse conduction of the first diode; and a third step for turning on the semiconductor switching device after the second step, a switching period of the semiconductor switching device being shorter than a carrier lifetime of the first diode.

17. A control process according to claim 16 wherein the third step comprises an operation for producing a detection signal when a reverse current of the first diode is reduced to zero and for producing a turn-on signal in response to the detection signal, to turn on the semiconductor switching device after the reverse conduction of the first diode.

18. A control process according to claim 16 wherein the third step comprises an operation for producing a detection signal when a voltage across the semiconductor switching device decreases to a minimum voltage and for producing a turn-on signal in response to the detection signal, to turn on the semiconductor switching device after the reverse conduction of the first diode.

19. A control process according to claim 16 wherein the second step comprises a first operation for returning most of the energy in the voltage clamp through the inductive component to the dc power source during a reverse conduction period of the first diode, and a second operation for returning a remaining amount of the energy in the voltage clamp to the dc power source through a discharge circuit.

20. A switching power supply system according to claim 1 wherein the system further comprises a capacitive component connected across the switching device, and the control circuit delivers a turn-on signal to the switching device after an end of reverse conduction of the first diode.

21. A switching power supply according to claim 2 wherein, when the switching device is opened, the series combination, the inductive component and the power source form a loop in which an anode of the diode of the series combination is connected with a positive terminal of the power source and a cathode of the diode is connected with a negative terminal of the power source.

22. A switching power supply system according to claim 10 wherein the discharge circuit comprises a first resistor and a transistor.

23. A switching power supply system according to claim 22 wherein the discharge circuit further comprises a second resistor and a zener diode, a first electrode of the transistor and a anode of the zener diode are connected together to a first terminal of the discharge circuit, the first resistor is between a second terminal of the discharge circuit and a second electrode of the transistor, the zener diode is between the first electrode and a control electrode of the transistor, and the second resistor is between the control electrode and second electrode of the transistor.

24. A switching power supply system according to claim 22 wherein, the discharge circuit further comprises a second resistor and a control section, a first electrode of the transistor and a first end of the control section are connected together to a first terminal of the discharge circuit, the first resistor is between a second terminal of the discharge circuit and a second electrode of the transistor, the control section is between the first electrode and a control electrode of the transistor, and the second resistor is between the control electrode and second electrode of the transistor.

25. A switching power supply system according to claim 22 wherein, the control circuit comprises an f/v conversion circuit, an differential amplifier circuit, a reference voltage source, a photo-coupler and a resistor, the f/v converting circuit receives a drive signal supplied from the control circuit to the semiconductor switching device, and produces a dc voltage of a magnitude corresponding to a conversion frequency of the switching power supply system, the differential amplifying circuit receives this dc signal from the f/v converting circuit and a reference voltage from the reference voltage source, and produces an error signal by amplifying a difference therebetween to a desired level, the error signal is supplied to a control electrode of the transistor of the discharge circuit, through the photocoupler.

* * * * *